US008440945B2

(12) United States Patent
Blumenthal et al.

(10) Patent No.: US 8,440,945 B2
(45) Date of Patent: May 14, 2013

(54) CONTROL UNIT FOR ELECTRIC HOUSEHOLD APPLIANCE

(75) Inventors: Peter Blumenthal, Traunstein (DE); Bernward Reinker, Regenstauf (DE); Bernd Stitzl, Lauter (DE)

(73) Assignee: BSH Bosch und Siemens Hausgeraete GmbH, Munich (DE)

( * ) Notice: Subject to any disclaimer, the term of this patent is extended or adjusted under 35 U.S.C. 154(b) by 1138 days.

(21) Appl. No.: 11/059,085

(22) Filed: Feb. 14, 2005

(65) Prior Publication Data

US 2005/0189820 A1 Sep. 1, 2005

Related U.S. Application Data

(63) Continuation of application No. PCT/EP03/07951, filed on Jul. 21, 2003.

(30) Foreign Application Priority Data

Aug. 14, 2002 (DE) .................................. 102 37 289
Sep. 25, 2002 (DE) .................................. 102 44 917

(51) Int. Cl.
*H05B 6/12* (2006.01)
*H01H 3/00* (2006.01)

(52) U.S. Cl.
USPC ........... 219/625; 219/622; 219/620; 307/104; 200/18

(58) Field of Classification Search .................. 219/625, 219/622, 663, 660, 445.1, 448.11, 452.12, 219/457.1; 338/200, 164, 12; 341/15; 307/104; 236/15 A, 68 D
See application file for complete search history.

(56) References Cited

U.S. PATENT DOCUMENTS

| 3,692,239 | A | * | 9/1972 | Genbauffe | .................. 236/15 A |
| 4,983,812 | A | * | 1/1991 | Worrall et al. | ............. 219/445.1 |
| 4,983,832 | A | | 1/1991 | Sato | |
| 5,920,131 | A | | 7/1999 | Perrin et al. | |
| 6,498,326 | B1 | | 12/2002 | Knappe | |
| 6,812,435 | B2 | * | 11/2004 | Schilling | .................... 219/457.1 |
| 6,838,785 | B2 | * | 1/2005 | Schilling | ....................... 307/104 |

FOREIGN PATENT DOCUMENTS

| DE | 19906365 A1 | 8/2000 |
| EP | 1014001 A2 | 6/2000 |
| EP | 0962707 A3 | 1/2003 |

* cited by examiner

*Primary Examiner* — Quang Van
(74) *Attorney, Agent, or Firm* — James E. Howard; Andre Pallapies

(57) ABSTRACT

A control unit for an electric household appliance for setting functions and operating parameters. The control unit includes at least one control knob located on a display panel by magnetic force. The control knob capable of being pushed by an operator from an initial position into a selecting position to select a function, such as a specific cooking plate and capable of being rotated about its axis to set an operating parameter of the function, such as the cooking temperature of the cooking plate.

3 Claims, 4 Drawing Sheets

CONTROL UNIT FOR ELECTRIC HOUSEHOLD APPLIANCE

The present invention relates to a control unit for an electrical domestic appliance for setting operating functions and parameters with a control knob fixed on a display panel, which can be pushed for selecting an operating function, such as selection of a cooking plate, from an initial position to a selecting position and which can be rotated for setting the operating parameter, such as a heating stage, about an axis.

A generic control unit for an electrical domestic appliance is described in EP 0 962 707 A1. A control knob fixed on a display panel serves to set operating functions, for example for selecting a specific cooking plate of an electric stove and can be pushed or respectively swivelled from an initial position to a selecting position for this purpose. For setting an operating parameter, for example a heating stage, the control knob can also be rotated about an axis. An embodiment of this generic control unit provides a closed display panel, on which the control knob is releasably fixed by means of magnet force. The maximum permissible shift ways are preset by a guiding pin of the control knob engaging in a guide of the display panel and sliding along there.

The object of the present invention is to improve a control unit according to preamble of claim 1, resulting in easy operating and simple attachment and improved function with the domestic appliance.

According to the present invention this task is solved by a control unit according to preamble of claim 1, such that a magnetic arrangement with several fixed arranged magnets is provided for magnetic fixing of the control knob in the region of the plate, which arrangement exerts magnetic pull force on at least one permanent magnet and/or a ferromagnetic element of the control knob and enables rotary and push movements of the control knob. This type of inventive control unit enables simple and clear operating of the electrical domestic appliance. In this way an operating function, comprising for example selection of a specific cooking plate of an electrical stove, can be selected by pushing the control knob from an initial position to a selecting position. By rotating the control knob in the usual manner an operating parameter of the previously selected operating function can be influenced.

By rotating the control knob about its axis for example a heating stage of the previously selected cooking plate can be influenced. The control knob can remain unchanged in the hand of a user from the first operating step, selection of the operating function to the second operating step, when the operating parameter of the selected operating function is set. A change of grip or operating of an additional element of the control unit is not required. Each operating step is also assigned its own, characteristic type of movement of the control knob. By way of the cooperating permanent magnet of the display panel and of the control knob the latter can be removed from the plate and pushed and/or almost random on the plate. The plate can be designed fully flat and can thus be cleaned optimally of accumulating dirt. All possible pushing and rotary movements of the control knob are defined exclusively by the configuration of the cooperating magnetic elements.

A stop position in each case in one of the selecting positions can be indicated according to a configuration of the invention by an optical and/or acoustic signal.

The user is thus shown that the control knob is in the selecting position and should not be pushed beyond this.

A safety function can comprise for example the previously selected operating function by lifting the control knob or by switching it off if it is pushed too far beyond its stop position.

The pushing and rotary movements of the control knob can be scanned and recorded in a way known per se by inductive, optical or magnetic methods. The abovementioned scanning methods can also be combined with one another, if required.

A first configuration of the invention provides that the control knob slides back automatically from each of the selection positions into the initial position. An alternative configuration can consist of the control knob remaining in each or only in some of the selecting positions and having to be brought out of these by pushing back into the initial position. These alternative configurations can in each case be realised by suitable designs and arrangements of the intercommunicating magnetic elements.

A central magnet and several crown magnets grouped around the former at a preset distance are preferably provided in each case uniformly circular in the region of the plate. Each of the crown magnets defines one of the possible selecting positions, into which the control knob can be pushed. In the case of four available operating functions, for example four cooking plates of an electric stove, at least four different selecting positions are necessary. In an advantageous further development of the invention however additional selecting positions can be provided, endowed with additional functions. So, for example in an electric stove six selecting positions can be provided for selection of four cooking plates and for controlling additional functions. Such additional functions can be for example a timer control, central zone switching or the like. If six such selecting positions are provided, then six crown magnets are correspondingly required grouped around the central magnet.

A configuration of the invention provides on an underside of the control knob a retaining magnet and a ferromagnetic disc with at least three arms. Preferably the ferromagnetic disc, which can be configured for example as pole spider made of soft iron, likewise has many arms, such as crown magnet provided in or respectively on the display panel. The pole spider made of soft iron has a magnetising effect of the arms in a polarity opposite the underside of the retaining magnet.

In this way the positioning of the arms on the corresponding crown magnets has the effect of repelling or attracting, depending on how the crown magnets are oriented. The crown magnets are preferably arranged in the same polarity as the central magnet of the display panel. The control knob with its retaining magnets can thus be pushed onto one of the crown magnets and accordingly undergoes magnetic attraction. Since the pole spider made of soft iron preferably has the opposite polarity to the underside of the control knob, rotation of the control knob causes locking in, in turn caused by the repelling forces when the arms of the pole spider are brushed over by the crown magnets or respectively the central magnet.

One control knob, which has two or three selecting positions corresponding thereto, can in each case provided selectively for controlling two or three operating functions. One control knob can likewise have several selecting positions, for example six or eight, so that one control knob can suffice for overall control of an electrical appliance.

It is particularly advantageous if an activation region, into which the control knob for selecting the control function must be pushed, is provided at a distance from the outer circumference of the central magnet. The distance from the activation region prevents the control knob from being pushed unintentionally into the selecting position during a rotary movement in its initial position. This therefore enables a certain eccentric rotary movement of the control knob in its initial position, without a selecting position being selected unintentionally. A distance between the activation region and the central magnet of at least 5 mm has proven to be particularly beneficial.

It is also an advantage if an outer limit stop of the activation region is spaced at up to 15 mm from the periphery of the central magnet. This sufficiently guarantees major magnetic reset forces of the central magnet to support resetting of the control knob from the activation region to the initial position. Also, the result from this for the user is a brief and thus comfortable ejection distance covered of the control knob. At the same time the space requirement of the entire control unit in the domestic appliance is sufficiently reduced. The last design of the activation region also ensures reliable detection of a pushing movement of the control knob. This is particularly significant with inductive and/or optical scanning of the control knob only at time intervals.

In terms of safety the selection of an operating function done with the control knob can be made advantageously only when the control knob is reset to its initial position on expiry of a preset time interval.

If this is not the case a fault in the selection procedure can be assumed. The time interval is preferably between two to five seconds.

The invention will now be described hereinbelow by means of embodiments of the inventive control unit in the example of a cooking plate, in which.

Figure 1:
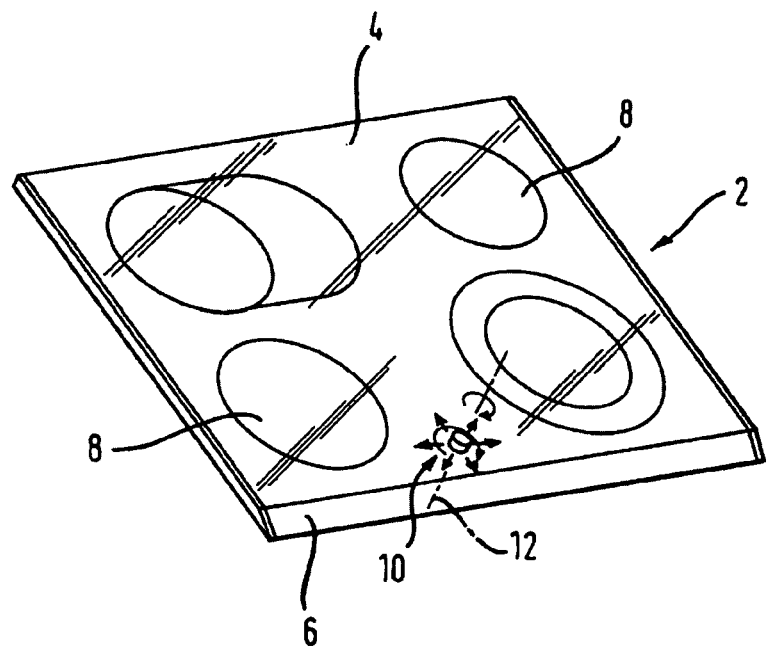
FIG. 1 is a perspective view of a cooking plate with a control unit.

FIG. 1 is a perspective view of a cooking plate 2 with a control unit arranged thereon in the form of a control knob 10. The cooking plate 2 has a glass ceramic plate 4, terminating frontally in a plate facet 6. Provided on the glass ceramic plate 4 in the illustrated embodiment are four cooking plates 8 heatable in a manner known per se, which can be marked correspondingly with decoration. In the frontal plate facet 6 or on the surface of the glass ceramic plate 4 a display element or respectively several display elements (not shown) can be fixed, which indicate selected operating functions or respectively operating parameters. In a central front region of the glass ceramic plate near the plate facet 6 is arranged a control knob 10, which can be rotated about an axis 12 and pushed in various defined directions from a middle initial position into selecting positions.

Figure 2:
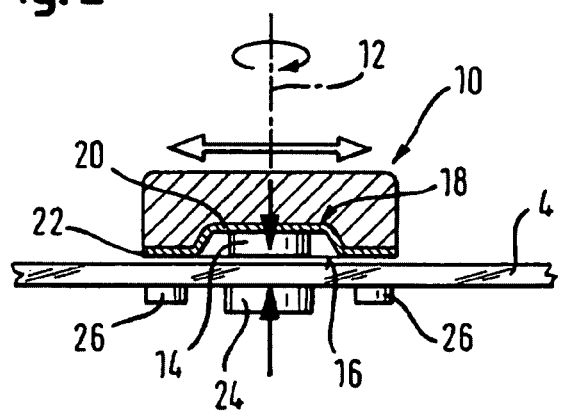
FIG. 2 is a schematic partial section of a control knob of the control unit.

FIG. 2 shows a schematic section of the glass ceramic plate 4 with the control knob 10 fixed thereon. This is fixed by means of magnetic force on the glass ceramic plate 4 and can be pushed parallel to its surface or respectively rotated about its axis 12. According to the present invention the pushing movements of the control knob 10 in its various selecting positions and the possible rotary movements about its axis 12 are defined exclusively by the arrangement of permanent magnet or respectively one or more magnetic elements in the control knob 10. Arranged on the underside of the glass ceramic plate 4 is a central magnet 24, around which are grouped several crown magnets 26 at a defined distance. The central magnet 24 has stronger magnetising than the crown magnet 26, as indicated by the differing size. Attached centrally to a toggle underside 16 of the control knob 10 is a retaining magnet 14, which has opposing polarity to the central magnet 24 and preferably has approximately the same size as the former. Attached on and going out from an upper side of the retaining magnet 14 averted from the toggle underside 16 is a pole spider 18 in the form of a star-shaped disc with outwards pointing arms 22, which preferably comprises soft iron and thus the same polarity as the upper side of the retaining magnet 14.

Because the crown magnets 26 are preferably mounted in the same polarity direction as the central magnet 24, there are repelling magnetic forces the arms 22 of the pole spider 18 and the upper sides of the crown magnet 26 in each case.

Recording the pushing movements of the control knob 10 for selection of the available operating functions and the rotary movements for selection of the available operating parameters of the electrical domestic appliance can occur in a known manner, for example by means of inductive and/or optical scanning. These scanning methods in each case enable precise touch-free signal transfer and thus reliable operating of the electrical domestic appliance.

Figure 3:
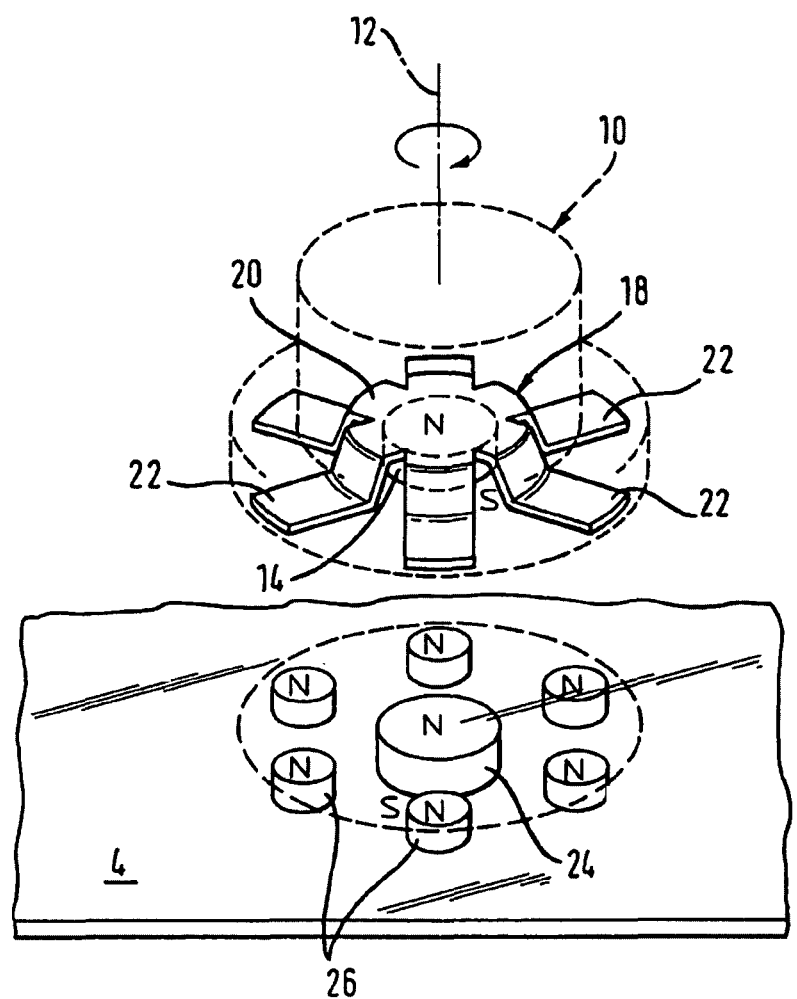
FIG. 3 is an exploded view of the inventive control unit for illustrating the cooperating magnetic elements of the display panel and the control knob.

FIG. 3 shows a schematic exploded view of the control knob 10 lifted from the surface of the glass ceramic plate 4. In this perspective illustration the grouping of the permanent magnet under the glass ceramic plate 4 and the arrangement of the magnetic elements of the control knob 10 are easily recognised. In the illustrated embodiment six crown magnets 26 are provided in each case evenly grouped at the same distance about the central magnet 24, whereof the north pole N points up to the control knob 10 and whereof the south pole S points in the opposite direction. The central magnet 24 has the same polarity as the north pole N upwards. The south pole S of the retaining magnet 14 of the control knob 10 points to the toggle side 16 and is therefore attracted by the central magnet 24. The arms 22 of the pole spider 18 attracted by a central region 20 lying on the north pole N of the retaining magnet 14 and laterally downwards have the same directed polarity as the upper side of the retaining magnet 14 and are therefore repelled by the crown magnets 26 in each case. This repelling effect between the arms 22 and the crown magnet 26 thus affects a number of lock-in positions of the control knob 10 rotated about its axis 12. In the illustrated embodiment these are six locking stages. The control knob can be pushed selectively with its retaining magnet 14 by one of the crown magnets 26 and is thus located in one of six selecting positions. Depending on the selected distance between the crown magnets 26 and the central magnet 24 the control knob 10 slides automatically back into its initial position after release, in which retaining magnet 14 and central magnet 24 are situated over one another like a cover. When there is a large enough selected distance between central magnet 24 and crown magnet 26 the magnetic force exerted by the central magnet on the retaining magnet 14 is too weak for the latter to remain in its selected selecting position and having to be pushed back into the initial position.

Figure 4:
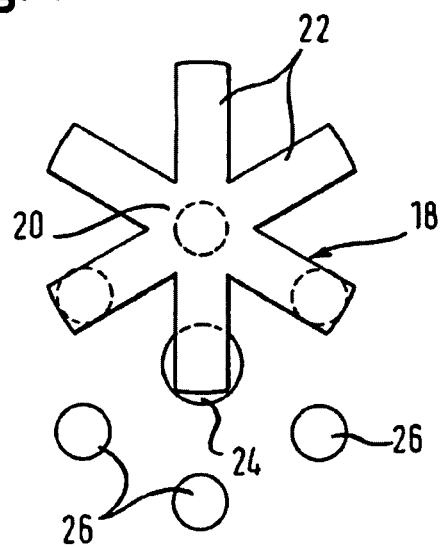
FIGS. 4 and 5 are schematic illustrations of the cooperating magnetic elements of the display panel and the control knob.
Figure 5:
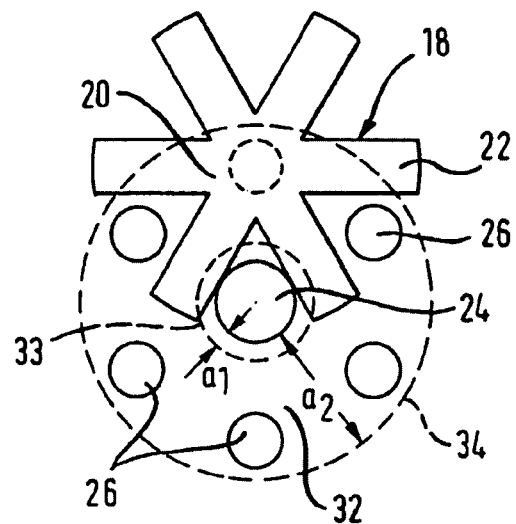

FIGS. 4 und 5 illustrate schematically the array of the pole spider 18 relative to the magnets 24, 26 of the display panel. The pole spider 4 is located with its central region 20, under which the retaining magnet 14 is arranged, in each case above the uppermost of six crown magnets 26. FIG. 4 shows the situation of a repelling magnetic force between both crown magnets 26 adjoining the uppermost crown magnet and the arms 22 of the pole spider 18. FIG. 5 illustrates a rest position of the control knob, in which the arms 22 of the pole spider 18 are in each case located in spaces between adjoining crown magnets 26 of the display panel. A typical ejection path can be between 3 and 20 mm.

FIG. 5 shows an activation region 32 in dashed lines. Arranged within the activation region 32 are the six crown magnets 26. An inner first limit stop 33 of the annular activation region 32 extends at a distance a1 of 5 mm concentrically around the central magnet 24. For selecting one of the selecting positions 30 assigned to the crown magnet 26 the control knob 10 must be pushed into the activation region 32. The distance a1 is of such a size that eccentric rotary movements of the control knob in its initial position do not cause unintentional wandering of the control knob 10 to the crown magnet 26. An outer second limit stop 34 of the activation region 32 extends according to FIG. 5 concentrically around the inner limit stop 33 and is located at a distance a2 of 15 mm in a radial direction from the outer periphery of the central magnet 24. If the control knob 10 is located between the first and second limit stops 33, 34 of the activation region 32, the magnetic reset forces of the central magnet 24 are still strong enough to support resetting the control knob 10 in its initial position 28.

For safety reasons according to the embodiment of FIG. 5 the whole selection procedure of the control knob may not last longer than 2 seconds.

When the time interval is exceeded the selection of the operating function, or the selection of one of the cooking plates 8, is not recorded.

Figure 6:
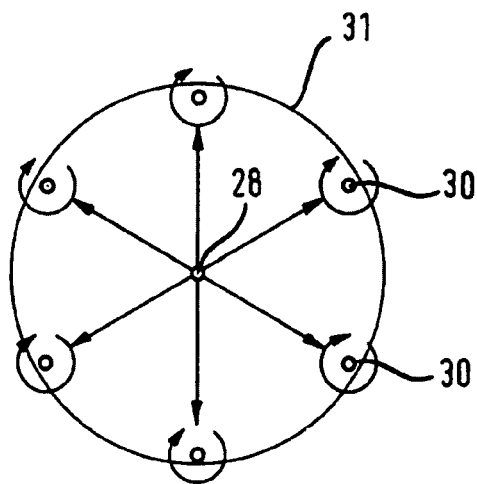
FIGS. 6 and 7 are principle illustrations of different operating variations of the control unit.
Figure 7:
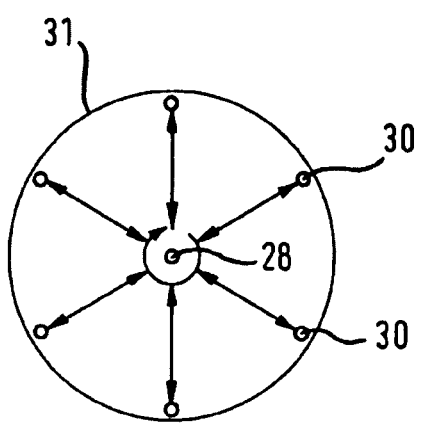

During the excursion procedure optical and/or acoustic acknowledging by means of a signal unit 31, as shown in FIGS. 6 and 7, on a fixed excursion width is meaningful. It requires the user not to turn the control knob any further, but to leave it in this position or to let it slide back into its middle position automatically through magnetic reset forces. With optical acknowledging preferably an annular illuminated segment 31 is used as optic stop for the fixed excursion width and direction. The illuminated segment preferably lights precisely when the edge of the control knob has reached the fixed excursion width. The light mark under the glass ceramic cover is achieved by the edge of the control knob, without covering it. At this point a brief sound signal can be inserted as support. With exclusively provided acoustic acknowledgement the same functionality is fulfilled without light mark. Both types of acknowledgement can also be used in combination, to differentiate e.g. main excursion directions or lesser excursion directions.

In a preferred configuration of the invention the light marking is used to select cooking plates and stays lit until another cooking plate is selected. Then the cooking stage of the selected and indicated cooking plate can be set by rotating the control knob in the middle position and altered directly every time without prior excursion.

To operate the control unit the control knob can for example be pushed according to FIG. 6 in a view from the central initial position 28 into six different selecting positions 30. In these selecting positions 30 the control knob can then in each case be rotated. To decrease the heating stage of a cooking plate 8 the control knob can then be pushed into the corresponding selecting position 30 and rotated anticlockwise. On account of the sufficient distance between central magnet and crown magnet the control knob remains in each case in the selected selecting position 30 and can be rotated there.

According to FIG. 7 the control knob can be actuated in an alternative way, as follows. For selection of an operating function, thus the desired cooking plate 8, the control knob is pushed by the user out of the middle initial position 28 into the corresponding selecting position 30. On completion of selection of one of the cooking plates 8 the user pushes the control knob back to the central initial position 28. Adjusting the operating parameter, thus the heating stage of the selected cooking plate 8, then occurs by rotating the control knob in the central initial position 28. In addition or alternatively it can also be provided that for example gradual increasing or decreasing of the heating stage of a selected cooking plate 8 occurs by repeated pushing of the control knob from the initial position 28 to the corresponding selecting position 30.

In both illustrated a connection of the inventive functionality of the control knob with additional touch sensors is possible, for example to realise an independent main switch. Removing the control knob during operation could switch off all cooking plates after a warning phase and thus engage unilaterally in the main switch. This warning can be given acoustically and/or optically. Further functions can be activated in both variants through repeated ejecting in the same direction in a so-called toggle mode, such as for example zone switching.

A significant advantage of the inventive arrangement of the control unit is that the central control knob is easy to clean and remove and thus enables cleaning of the fully flat glass ceramic plate, which additionally no holes or projections. The whole display area with its printing and the light markings grouped in its vicinity can be designed very small and thus economically. It is likewise easy to clean, as is a cooking vat with touch control, without the associated disadvantages, such as for example the unavoidable finger prints as heat influences occurring when a possibly hot glass ceramic surface is touched.

LEGEND 2 cooking plate
4 glass ceramic plate
6 plate facet
8 cooking plate
10 control knob
12 axis
14 retaining magnet
16 toggle underside
18 pole spider
20 central region
22 arm
24 central magnet
26 crown magnet
28 initial position
30 selecting position
31 signalling unit
32 activation region
33 first limit stop
34 second limit stop
N north pole (magnet)
S south pole (magnet)

The invention claimed is:

1. A control unit for an electrical domestic appliance for setting operating functions and parameters, comprising:
 a plate and at least one control knob fixed magnetically on said plate in an initial position;
 said control knob being configured for lateral movement on said plate away from said initial position for selecting an operating function, said control knob movable on said plate in a first lateral movement from said initial position to a first away position for selecting an operating function and movable in a return movement from said first away position to said initial position and said control knob being movable on said plate in a second lateral movement from said initial position to a second away position for selecting thereby another operating function and subsequently being movable in a return movement from said second away position to said initial position with the path of out and back movement of said control knob between said initial position and said first away position being different than the path of out and back movement of said control knob between said initial position and said second away position;

said control knob being configured for rotation about its axis on said plate for setting an operating parameter, including setting a specific heating stage for said cooking plate;

said control knob including one of at least one permanent magnet and a ferromagnetic element;

said control knob being fixed magnetically on said plate by a magnetic array including a plurality of fixed magnets which exert magnetic pulling power on said permanent magnet and/or said ferromagnetic element;

said magnetic array pulling power enables said lateral and rotating movement of said control knob; and a signaling unit providing one of an optical signal and an acoustical signal that indicates a respective position of said control knob when a given one of an operating function has been selected or when a given one of an operating parameter has been set by said control knob, wherein one of said at least one permanent magnet and a ferromagnetic element of said control knob comprises a retaining magnet, said magnetic array includes a central magnet, one crown magnet associated with said first away position, and another crown magnet associated with said second away position, at least one of said central magnet of said magnetic array and said crown magnets lie opposite antipole to said retaining magnet of said control knob to exert magnetic attraction therebetween and, after a lateral movement of said control knob on said plate away from said initial position to a respective one of said first and second away positions for selecting an operating function, said crown magnets are operable to exert magnetic attraction on said control knob in opposition to a magnetic attraction exerted by said central magnet such that said crown magnets magnetically retain said control knob in said respective one of said first and second away positions while said control knob is rotated about its axis on said plate for setting an operating parameter.

2. A control unit for an electrical domestic cooking appliance for setting operating functions and parameters, comprising:

a body defining a cooking area;

a cooktop extending across said cooking area;

at least one cooking plate operationally associated with said cooktop;

a control support surface defined on said continuous cooktop;

at least one control knob disposed on said control support surface in an initial position and defining a rotational axis generally perpendicular with respect to said control support surface, wherein said control knob is configured for lateral movement on said control support surface away from said initial position while maintaining said rotational axis in generally perpendicular alignment with said control support surface for selecting an operating function, including selecting at least one cooking plate for operational heating, and said control knob being movable on said control support surface in a first lateral movement from said initial position to a first away position for selecting thereby one operating function and subsequently being movable in a return movement from said first away position to said initial position and said control knob being movable on said control support surface in a second lateral movement from said initial position to a second away position for selecting thereby another operating function and subsequently being movable in a return movement from said second away position to said initial position with the path of out and back movement of said control knob between said initial position and said first away position being different than the path of out and back movement of said control knob between said initial position and said second away position; and wherein said control knob is configured for rotation about said rotational axis on said control support surface for setting an operating parameter, including setting a specific operational heating level for said selected at least one cooking plate; and means for defining a control magnetic attraction field disposed adjacent said control support surface for attracting said control knob to a predefined location on said control support surface and facilitating movement of said control knob across said control support surface and rotationally with respect to said control support surface.

3. A control unit for an electrical domestic cooking appliance according to claim 2 wherein said cooktop extends in a continuous manner over said cooking area and means for defining a control magnetic attraction field is disposed said underneath said continuous cooktop.

* * * * *